United States Patent
Tsai et al.

(10) Patent No.: US 9,076,868 B1
(45) Date of Patent: Jul. 7, 2015

(54) SHALLOW TRENCH ISOLATION STRUCTURE WITH SIGMA CAVITY

(71) Applicant: GLOBALFOUNDRIES Inc., Grand Cayman, KY (US)

(72) Inventors: HaoCheng Tsai, Clifton Park, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/334,953

(22) Filed: Jul. 18, 2014

(51) Int. Cl.
| | |
|---|---|
| H01L 21/762 | (2006.01) |
| H01L 29/78 | (2006.01) |
| H01L 21/306 | (2006.01) |
| H01L 29/06 | (2006.01) |
| H01L 29/66 | (2006.01) |

(52) U.S. Cl.
CPC ...... *H01L 29/7846* (2013.01); *H01L 21/76224* (2013.01); *H01L 21/30604* (2013.01); *H01L 29/0653* (2013.01); *H01L 29/66568* (2013.01)

(58) Field of Classification Search
CPC .................. H01L 21/76232; H01L 21/76264; H01L 21/76283
USPC ........................... 257/288, 506; 438/435–437
See application file for complete search history.

(56) References Cited

U.S. PATENT DOCUMENTS

| | | |
|---|---|---|
| 7,622,162 B1 | 11/2009 | van Schravendijk et al. |
| 7,745,351 B2 | 6/2010 | Chen et al. |
| 8,187,948 B2 | 5/2012 | Chen et al. |
| 2012/0241815 A1* | 9/2012 | Kim et al. .................... 257/190 |

OTHER PUBLICATIONS

Mistry et al., "A 45nm Logic Technology with High-k+Metal Gate Transistors, Strained Silicon, 9 Cu Interconnect Layers, 193nm Dry Patterning, and 100% Pb-free Packaging", 2007 IEEE, pp. 247-250.
Cam et al., "A Low Cost Drive Current Enhancement Technique using Shallow Trench Isolation induced Stress for 45-nm node", 2006 IEEE, 2 pgs.
Chung et al., "Novel shallow trench isolation process using flowable oxide CVD for sub-100nm DRAM", IEEE 2002, IEDM, pp. 233-236.
Trivedi et al., "Void-free filling of spin-on dielectric in 22 nm wide ultrahigh aspect ration Si trenches", J. Vac. Sci. Technol. B, vol. 27, No. 6, Nov./Dec. 2009, pp. 3145-3148.
Kahng et al., "Exploiting STI Stress for Performance", 2007 IEEE, 1-4244-1382-6/07, 8 pages.

* cited by examiner

*Primary Examiner* — Daniel Shook
(74) *Attorney, Agent, or Firm* — Williams Morgan, P.C.

(57) ABSTRACT

Embodiments of the present invention provide an improved shallow trench isolation structure and method of fabrication. The shallow trench isolation cavity includes an upper region having a sigma cavity shape, and a lower region having a substantially rectangular cross-section. The lower region is filled with a first material having good gap fill properties. The sigma cavity is filled with a second material having good stress-inducing properties. In some embodiments, source/drain stressor cavities may be eliminated, with the stress provided by the shallow trench isolation structure. In other embodiments, the stress from the shallow trench isolation structure may be used to complement or counteract stress from a source/drain stressor region of an adjacent transistor. This enables precise tuning of channel stress to achieve a desired carrier mobility for a transistor.

20 Claims, 11 Drawing Sheets

FIG. 11 ly to shallow trench isolation structures and methods of fabrication.

US 9,076,868 B1

SHALLOW TRENCH ISOLATION STRUCTURE WITH SIGMA CAVITY

FIELD OF THE INVENTION

The present invention relates generally to semiconductor fabrication, and more particularly, to shallow trench isolation structures and methods of fabrication.

BACKGROUND

Transistors are commonly used in the integrated circuits (ICs). Today's transistors with scaled critical dimensions (CD) demand higher carrier mobility for device performance. To improve carrier mobility (e.g., electrons or holes), strain engineering has been applied since the 90 nm complementary metal-oxide semiconductor (CMOS) node. Generally, inducing a tensile strain in the channel of n-type transistors improves electron mobility while a compressive strain in the channel of p-type transistors improves hole mobility. Various techniques have been proposed to induce the desired stress in the channel region of transistors. As transistors are scaled to smaller dimensions, there is a need for higher carrier mobility for switching speeds. Thus, stress/strain engineering has become increasingly important in recent years. It is therefore desirable to have improvements in the inducement and control of stressors for transistors.

SUMMARY

Embodiments of the present invention provide an improved shallow trench isolation structure and method of fabrication. The shallow trench isolation cavity includes an upper region having a sigma cavity shape, and a lower region having a substantially rectangular cross-section. The lower region is filled with a first material having good gap fill properties. The sigma cavity is filled with a second material having good stress-inducing properties. In some embodiments, source/drain stressor cavities may be eliminated, with the stress provided by the shallow trench isolation structure. In other embodiments, the stress from the shallow trench isolation structure may be used to complement or counteract stress from a source/drain stressor region of an adjacent transistor. This enables precise tuning of channel stress to achieve a desired carrier mobility for a transistor.

In a first aspect, embodiments of the present invention provide a semiconductor structure, comprising: a semiconductor substrate; a cavity formed in the semiconductor substrate, the cavity comprising an upper region and a lower region, wherein the upper region comprises a sigma cavity, and the lower region comprises a substantially rectangular cavity; a first dielectric layer disposed in the lower region; and a second dielectric layer disposed in the upper region, wherein the second dielectric layer is planar with a top surface of the semiconductor substrate.

In a second aspect, embodiments of the present invention provide a semiconductor structure, comprising: a semiconductor substrate; a transistor disposed on the semiconductor substrate, the transistor comprising a source/drain region and a gate; a shallow trench isolation structure disposed adjacent to the source/drain region, the shallow trench isolation structure comprising: a cavity formed in the semiconductor substrate, the cavity comprising an upper region and a lower region, wherein the upper region comprises a sigma cavity, and the lower region comprises a substantially rectangular cavity; a first dielectric layer disposed in the lower region; and a second dielectric layer disposed in the upper region, wherein the second dielectric layer is planar with a top surface of the semiconductor substrate.

In a third aspect, embodiments of the present invention provide a method of making a semiconductor structure, comprising: performing a first anisotropic etch in a semiconductor substrate to form a cavity; performing a sigma etch on the cavity to form an upper region of the cavity; performing a second anisotropic etch to form a lower region of the cavity; filling the lower region of the cavity with a first material; filling the upper region of the cavity with a second material; and planarizing the second material to a level flush with a top surface of the semiconductor substrate.

BRIEF DESCRIPTION OF THE DRAWINGS

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, are interchangeable and specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," "some embodiments," or similar language means that a particular feature, structure, or characteristic described in connection with the embodiment is included in at least one embodiment of the present invention. Thus, appearances of the phrases "in one embodiment," "in an embodiment," "in embodiments", "in some embodiments", and similar language throughout this specification may, but do not necessarily, all refer to the same embodiment. It will be understood that one skilled in the art may cross embodiments by "mixing and matching" one or more features of one embodiment with one or more features of another embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

Figure 1:
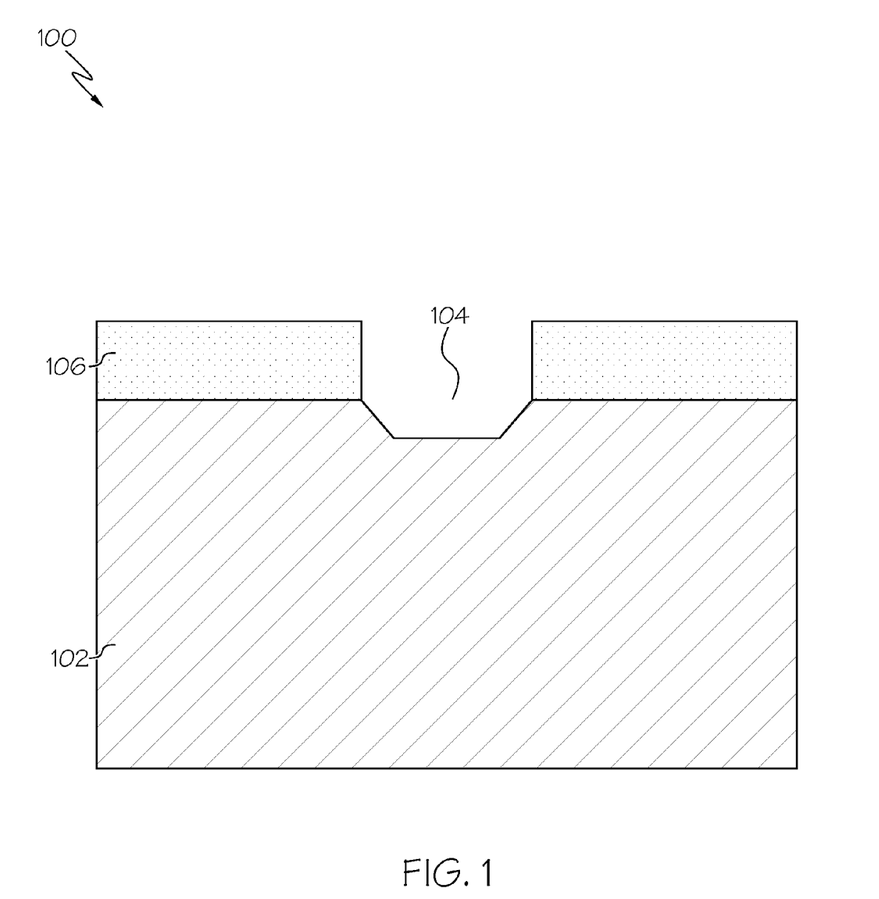
FIG. 1 is a semiconductor structure at a starting point for embodiments of the present invention.

FIG. 1 is a semiconductor structure 100 at a starting point for embodiments of the present invention. Semiconductor structure 100 includes a substrate 102 and a shallow trench isolation (STI) cavity 104 disposed in the substrate 102. In embodiments, substrate 102 may be a silicon (Si) substrate, silicon germanium (SiGe) substrate, or another suitable substrate. A protective layer 106 is deposited over the substrate 102. In embodiments, protective layer 106 may include a nitride such as silicon nitride (SiN), often referred to as hard mask.

Figure 2:
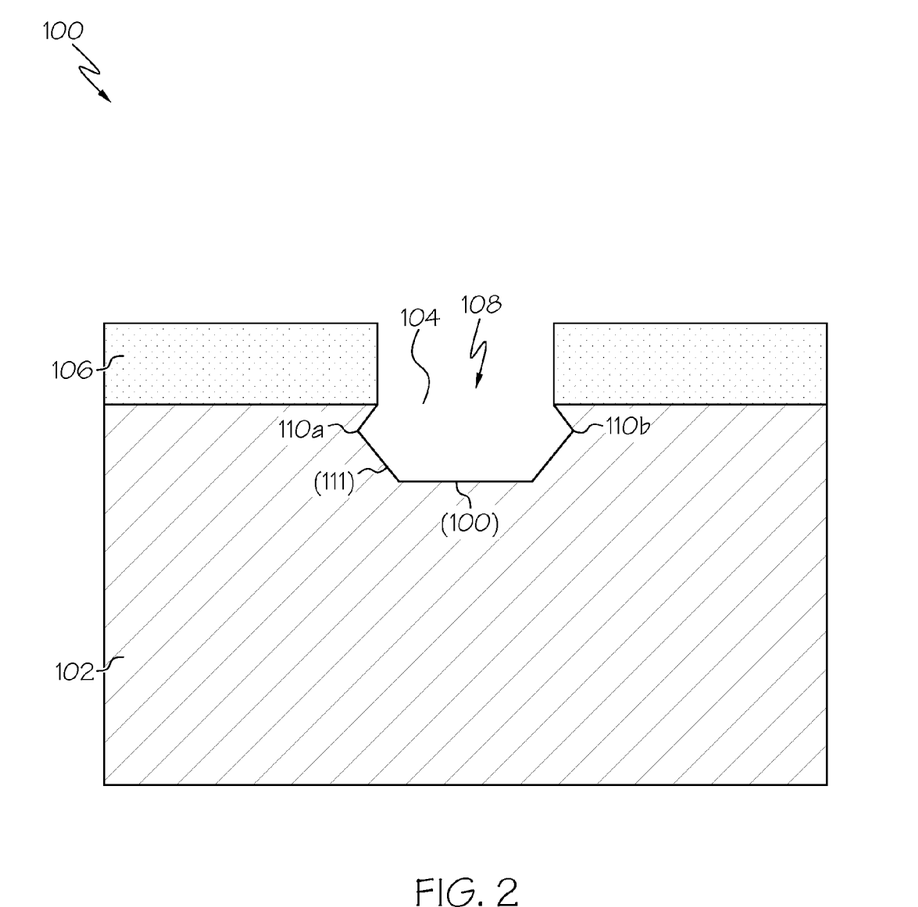
FIG. 2 is a semiconductor structure after a subsequent process step of forming a sigma cavity in an upper region of a shallow trench isolation cavity in accordance with embodiments of the present invention.
Figure 3:
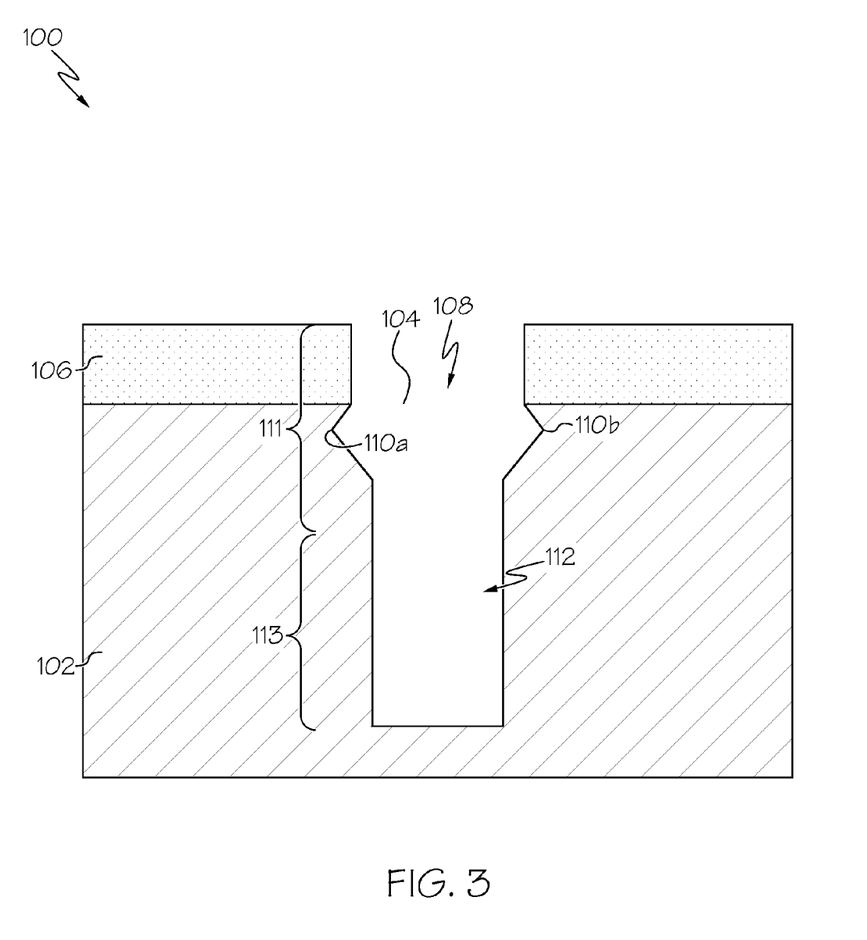
FIG. 3 is a semiconductor structure after a subsequent process step of forming a lower region of a shallow trench isolation cavity in accordance with embodiments of the present invention.

Referring now to FIGS. 2 and 3, STI cavity 104 is further extended to include a sigma cavity and a substantially rectangular lower region. FIG. 2 is semiconductor structure 100 after a subsequent process step of forming a sigma cavity 108 in an upper region 111 (see FIG. 3) of the shallow trench isolation cavity 104 in accordance with embodiments of the present invention. Sigma cavity 108 is formed as a result of, for example, employing a fast etch-rate on the bottom surface which has a crystalline plane of (100) of cavity 104 by anisotropic wet-etching (e,g., utilizing tetramethylammonium hydroxide (TMAH), ammonium hydroxide, and/or potassium hydroxide). The characteristic "sigma" shape of the sidewall is outlined by the slower etch-rate on the surfaces which have a crystalline plane of (111). Tips of the sigma cavity 108 are shown at 110a and 110b. FIG. 3 is semiconductor structure 100 after a subsequent process step of forming a substantially rectangular cavity 112 in lower region 113 of a shallow trench isolation cavity 104 in accordance with embodiments of the present invention. In embodiments, rectangular cavity 112 may have a slight taper (not shown) as a result of vertical anisotropic plasma etching (e.g. Cl-chemistry based plasma etching).

Figure 4:
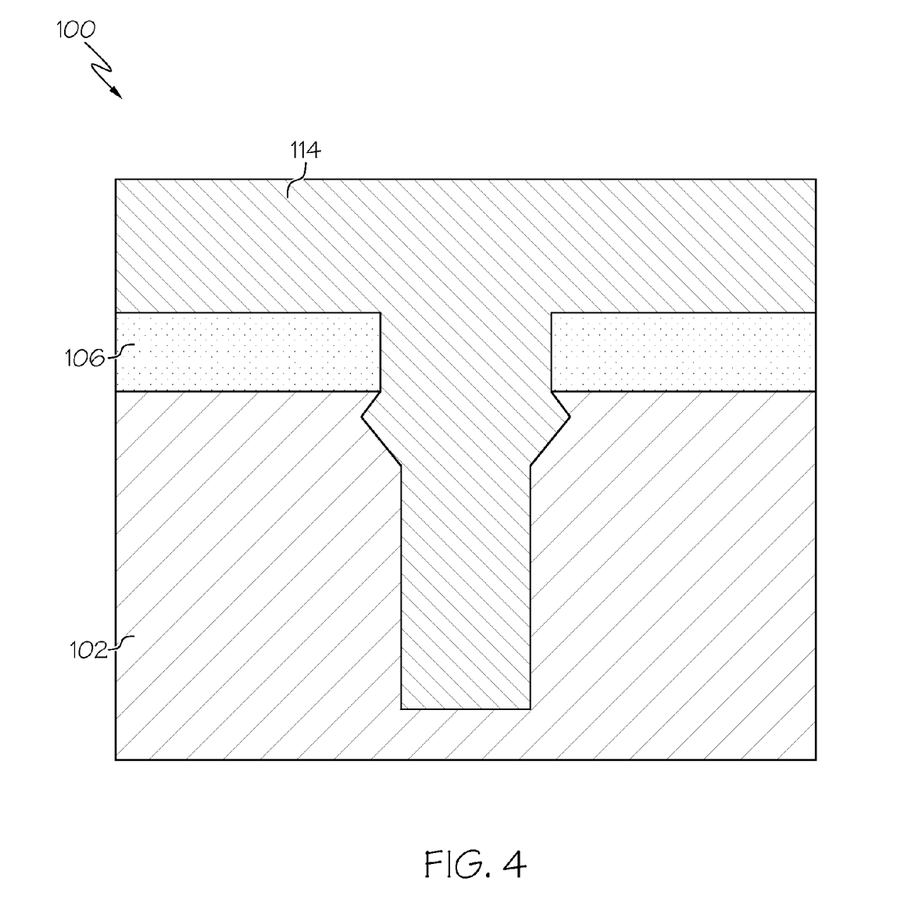
FIG. 4 is a semiconductor structure after a subsequent process step of depositing a first fill material.

FIG. 4 is a semiconductor structure 100 after a subsequent process step of depositing a first fill layer 114. In embodiments, the first fill layer 114 may be a dielectric. In embodiments, the first fill layer 114 may include spin-on dielectric, spin-on glass dielectric, or flowable oxide or another dielectric deposited by CVD (chemical vapor deposition) methods. The first fill layer 114 preferably has a superior capability of gap-fill as the trench cavity has a small top critical dimension (CD) and depth (i.e., the largest aspect ratio). Spin-on-glass (SOG) dielectric or spin-on dielectric (SOD) has the easiest (best) capability to gap-fill the trench (with small CD and high aspect ratio) and a reduced residual stress in contrast to CVD or plasma enhanced CVD methods. In the opposite manner, the high density plasma (HDP) CVD oxide, HARP (high-aspect-ratio process) oxide, or enhanced high-aspect-ratio process (eHARP) oxide has reduced capability to gap-fill the trench (with small CD and large aspect ratio) but increased residual stress.

Figure 5:
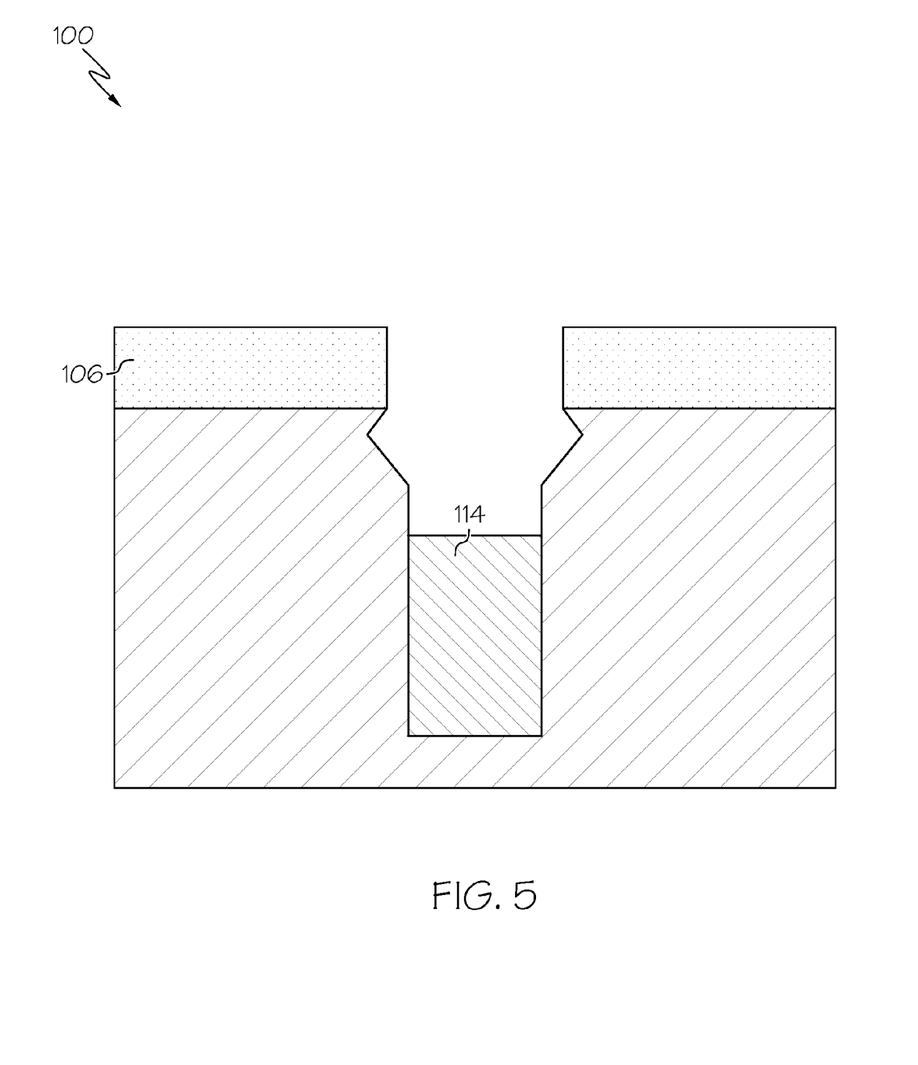
FIG. 5 is a semiconductor structure after a subsequent process step of recessing the first fill material.

FIG. 5 is a semiconductor structure 100 after a subsequent process step of recessing the first fill layer 114. In embodiments, the recessing can be achieved a by hydrofluoric (HF) etch, or (SiCoNi) process, or CMP, or a combination of these.

Figure 6:
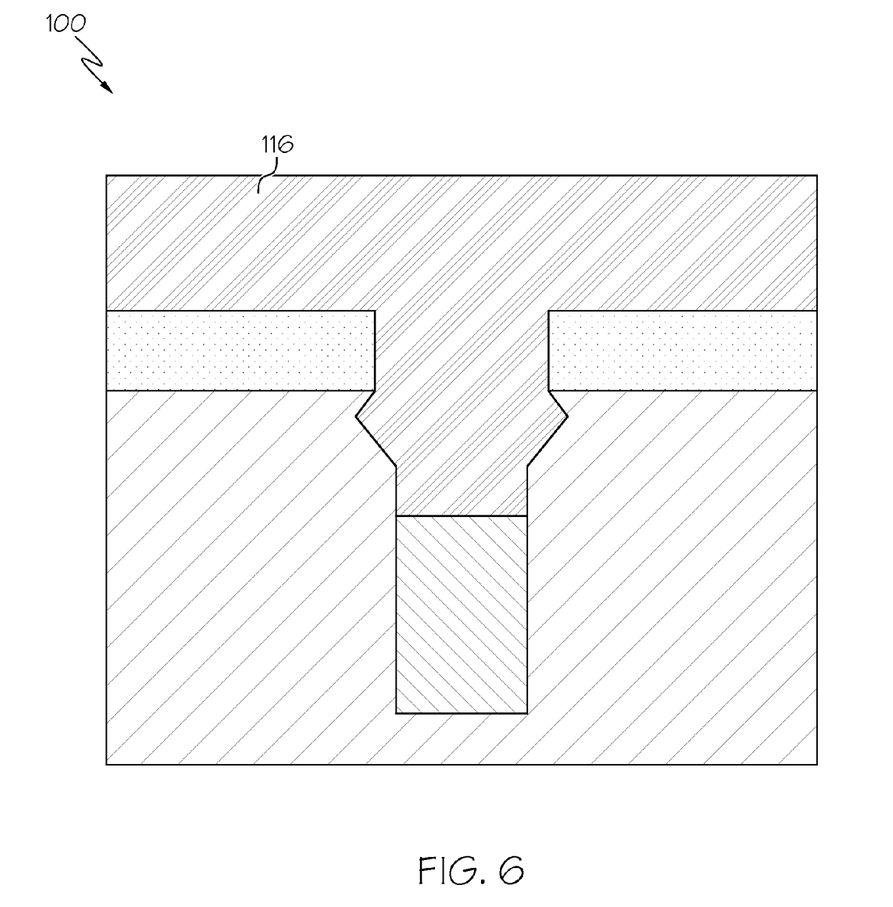
FIG. 6 is a semiconductor structure after a subsequent process step of depositing a second fill material.

FIG. 6 is a semiconductor structure 100 after a subsequent process step of depositing a second fill layer 116. In embodiments, the second fill layer 116 may include high density plasma (HDP) CVD oxide, silicon oxide, or HARP oxide. In embodiments, the depositing may be achieved by other chemical vapor deposition (CVD) methods. The second fill layer 116 does not require strong gap fill properties as needed with first fill layer 114 (see FIG. 5) because the aspect ratio of the upper region 111 is reduced.

Figure 7:
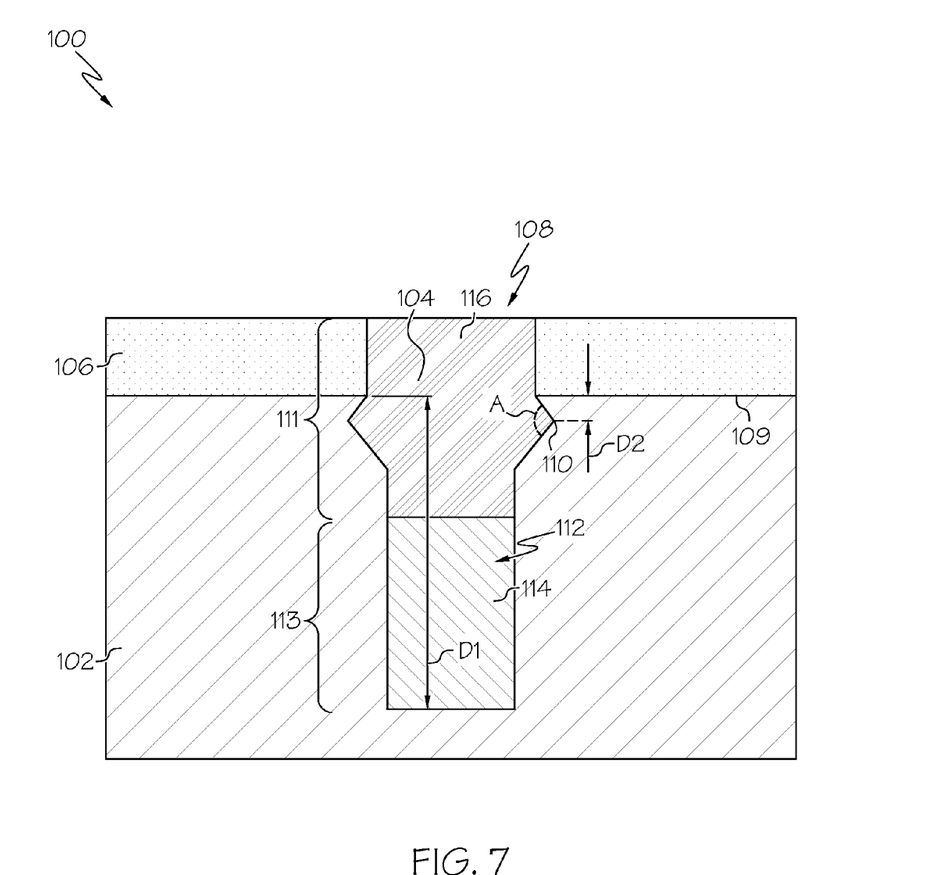
FIG. 7 is a semiconductor structure after a subsequent process step of recessing the second fill material.

FIG. 7 is a semiconductor structure 100 after a subsequent process step of recessing the second fill layer 116. The recessing causes the second dielectric fill layer 116 to be exposed and planar with a top surface of protective layer 106. In embodiments, the recessing may be performed by chemical mechanical polishing (CMP).

As shown in FIG. 7, the disclosed method results in a semiconductor structure 100 in accordance with embodiments of the present invention. The semiconductor structure includes a semiconductor substrate 102; a cavity 104 formed in the semiconductor substrate, the cavity 104 including an upper region 111 and a lower region 113, wherein the upper region includes a sigma cavity 108, and the lower region 113 includes a substantially rectangular cavity 112; a first dielectric layer 114 disposed in the lower region; and a second dielectric layer 116 disposed in the upper region, wherein the second dielectric layer 114 is planar with a top surface of a protective layer 106 over the substrate 102. The cavity 104 has a depth D1. In embodiments, D1 may range from about 100 nanometers to about 300 nanometers. The width of cavity 104 is continuously scaled to less than ~30 nm-50 nm at advanced complementary metal-oxide semiconductor (CMOS) node (e.g., 20 nm). Each of tips 110a and 110b (see FIG. 3) has an angle A. In embodiments, A may be 109.4 degrees. The tips are disposed at a distance D2 below the top surface of the substrate 109. Each of the tips 110a and 110b serves as a concentrator of the residual stress in the upper portion 111 of STI trench cavity 104 and can re-direct the stress laterally into the Si with peak stress positioned at a distance of D2 below the top surface of the substrate 109 (i.e., the position of the inversion charge carriers in the transistor channel). In embodiments, D2 ranges from about 6 nanometers to about 8 nanometers.

Figure 8:
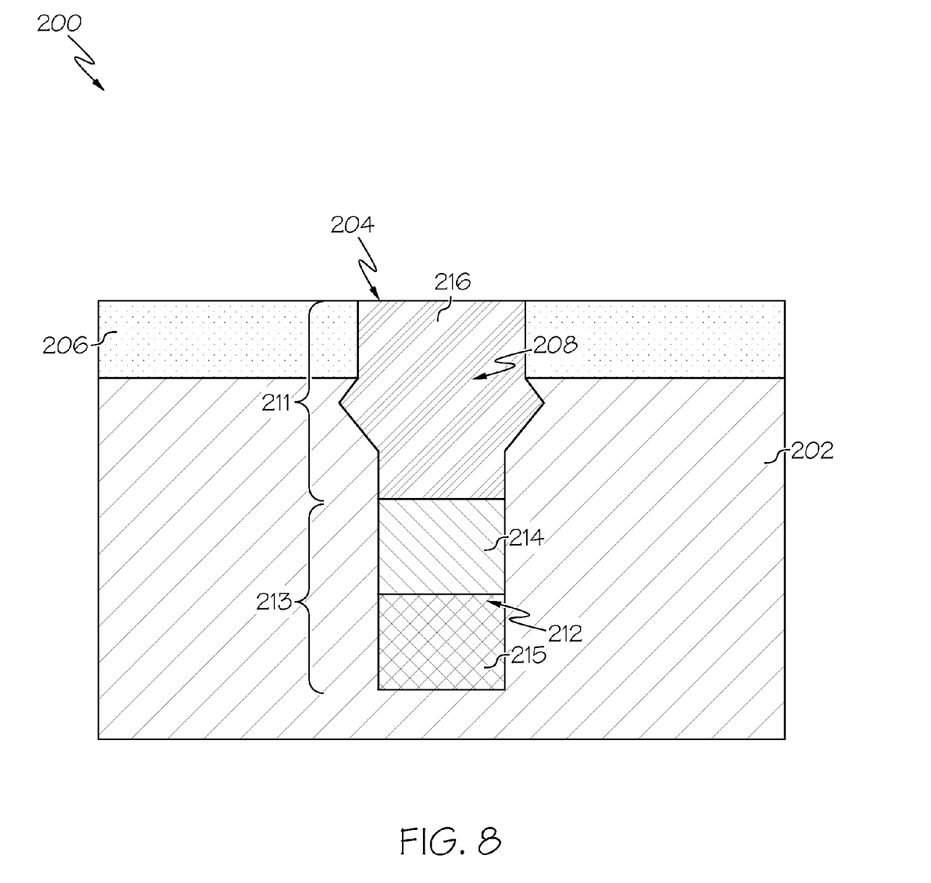
FIG. 8 is a semiconductor structure including three fill materials in accordance with alternative illustrative embodiments.

FIG. 8 is a semiconductor structure 200 including three fill layers in accordance with alternative illustrative embodiments. Semiconductor structure 200 includes a semiconductor substrate 202; a STI cavity 204 formed in the semiconductor substrate 202, the cavity 204 comprising an upper region 211 and a lower region 213, wherein the upper region 211 comprises a sigma cavity 208, and the lower region 213 comprises a substantially rectangular cavity 212. In this embodiment, three layers are disposed in the cavity 204 for the more advanced cavity 204 with small top CD and depth (as compared to the two layers of the embodiment of FIG. 7). Accordingly, dielectric layer 215 is deposited into cavity 204, followed by dielectric layer 214 above dielectric layer 215, and then dielectric layer 216 is deposited above dielectric layer 214. A protective layer 206 is the hard mask layer over the substrate 202. In embodiments, protective layer 206 may include a nitride such as silicon nitride (SiN). All other method steps to form the semiconductor structure of this embodiment are similar to those of FIGS. 1-7. In embodiments, the layer 214 may include a CVD oxide; the layer 216 may include a HARP oxide; and the layer 215 may include a flowable oxide, spin-on glass dielectric, or spin-on dielectric. Note that the dielectric layers are progressively easier to fill in the trench cavity 214 (i.e., the aspect ratio of cavity is progressively reduced toward the deposition of the last layer 216). Thus, the last (i.e., top) layer 216 for gap-fill can use the HDP method with the highest mechanical hardness and strain, though the least gap-fill capability. This embodiment is designed for an advanced STI cavity with smaller top CD and deeper depth (than FIG. 7) for future generations of CMOS. Certainly, the STI trench filling can be more than three layers at the cost of process complexity. The tips serve as a concentrator and re-direct the residual stress in the upper portion of STI trench laterally into the substrate with peak stress positioned at the same level of the inversion carriers in the transistor channel.

Figure 9:
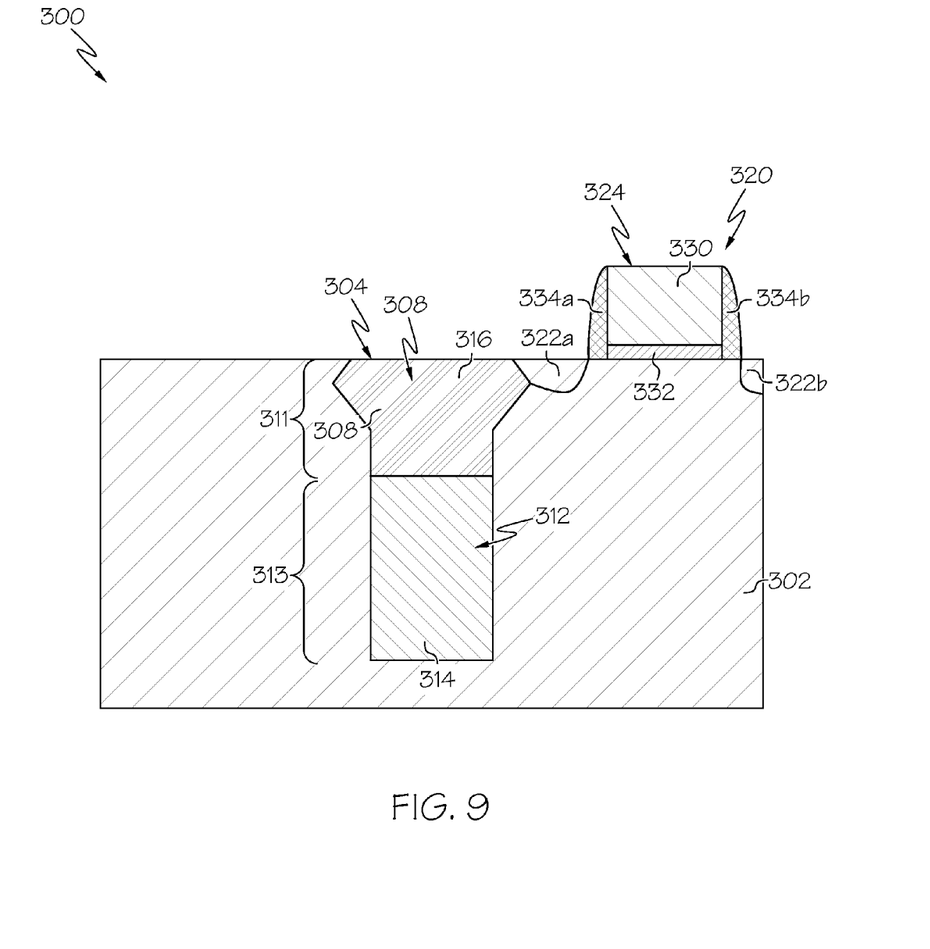
FIG. 9 is a semiconductor structure in accordance with embodiments of the present invention including a transistor.

FIG. 9 is a semiconductor structure 300 in accordance with embodiments of the present invention including a transistor. Semiconductor structure 300 includes a semiconductor substrate 302 and transistor 320 disposed on the semiconductor substrate 302. The transistor 320 includes a gate stack 324 and source/drain regions 322a-b without stressor material. The gate stack 324 includes a gate 330 over a gate dielectric 332, such as silicon oxide, hafnium oxide, or zirconium oxide, and spacers 334a and 334b at each side of the gate 330 and gate dielectric 332. In embodiments, the spacers can include a nitride or oxide such as silicon nitride or silicon oxide. A shallow trench isolation structure is disposed adjacent to the source/drain region 322a. The shallow trench isolation structure includes a cavity 304 formed in the semiconductor substrate 302, the STI cavity 304 comprising an upper region 311 and a lower region 313. The upper region comprises a sigma cavity 308, and the lower region 313 comprises a substantially rectangular cavity 312. A first dielectric layer 314 is disposed in the lower region 313, and a second dielectric layer 316 is disposed in the upper region 311, and is planar with a top surface of the substrate 302. In embodiments, the first dielectric layer comprises a spin-on dielectric, spin-on-glass dielectric, or flowable CVD oxide, and the second dielectric layer comprises a high density plasma (HDP) oxide and/or silicon nitride.

Figure 10:
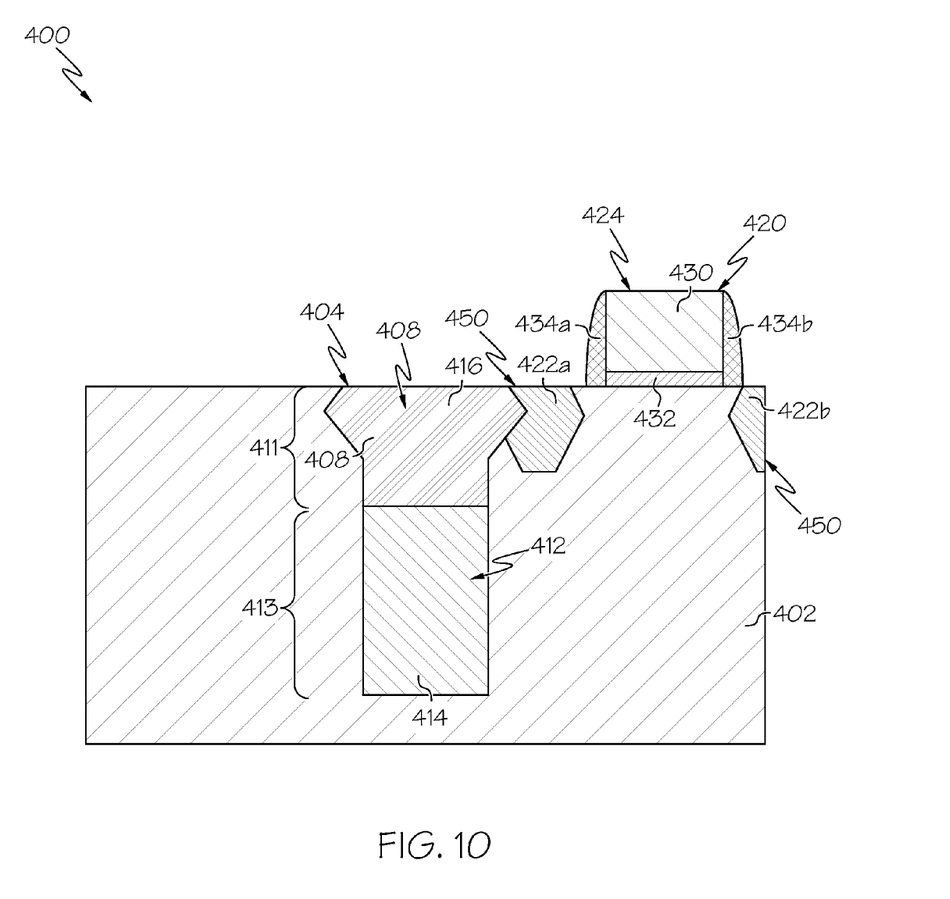
FIG. 10 is a semiconductor structure in accordance with alternative embodiments of the present invention including a transistor.

FIG. 10 is a semiconductor structure in accordance with alternative embodiments of the present invention including a transistor. Semiconductor structure 400 includes a semiconductor substrate 402 and transistor 420 disposed on the semiconductor substrate 402. The transistor 420 includes a gate stack 424 and source/drain region 422a-b including stressor material 450. The gate stack 424 includes a gate 430 over a gate dielectric 432, such as silicon oxide, hafnium oxide, or zirconium oxide, and spacers 434a and 434b at each side of the gate 430 and gate dielectric 432. In embodiments, the spacers can include a nitride or oxide such as silicon nitride or silicon oxide. A shallow trench isolation structure is disposed adjacent to the source/drain region 422a. The shallow trench isolation structure includes a cavity 404 formed in the semiconductor substrate 402, the STI cavity 404 comprising an upper region 411 and a lower region 413. The upper region comprises a sigma cavity 408, and the lower region 413 comprises a substantially rectangular cavity 412. A first dielectric layer 414 is disposed in the lower region 413, and a second dielectric layer 416 is disposed in the upper region 411, and is planar with a top surface of the substrate 402. In embodiments, the source/drain region 422a-b further include a compressive stress material and the second dielectric layer 416 includes a compressive stress material. In other embodiments, the source/drain regions 422a-b further include a tensile stress material and the second dielectric layer 416 includes a compressive stress material. In still other embodiments, the source/drain regions 422a-b further comprise a tensile stress material and the second dielectric layer 416 includes a tensile stress material. In still yet other embodiments, the source/drain region 422 further includes a compressive stress material and the second dielectric layer 416 includes a tensile stress material. Embodiments of the present invention may be used with PFET (p-type field effect transistor) or NFET (n-type field effect transistor) devices. For a PFET device, stressor material 450 may be comprised of silicon germanium for compressive stress. For an NFET device, stressor material 450 may be comprised of silicon phosphorus, silicon carbon, or silicon carbon phosphorus for tensile stress. In embodiments, the upper fill material (second dielectric layer 416) and stressor material 450 may be of similar or opposite stress types (tensile or compressive). This allows tuning of the channel stress to accommodate design flexibility.

Figure 11:
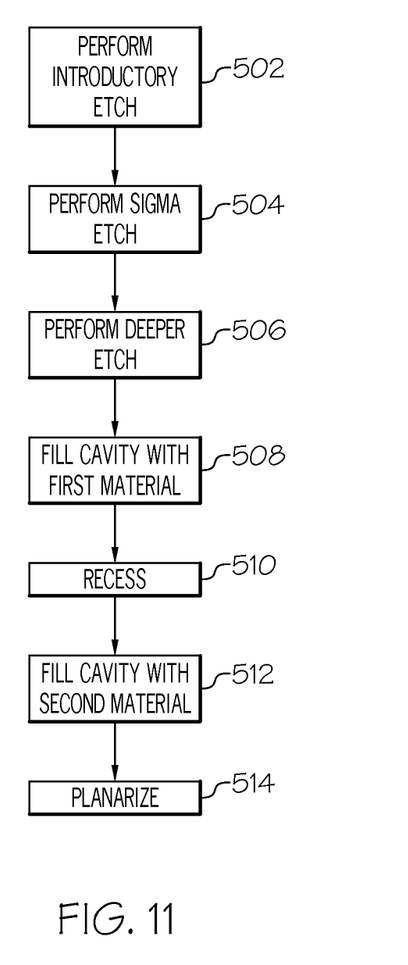
FIG. 11 is a flowchart indicating process steps for embodiments of the present invention.

FIG. 11 is a flowchart indicating process steps for embodiments of the present invention. At 502, a first etch in a semiconductor substrate is performed to form a cavity. The etch may be an anisotropic etch such as a reactive ion etch (RIE). At 504, a sigma etch is performed on the cavity to form an upper region of the cavity. The etch may be performed with a wet etch process utilizing, e.g., tetramethylammonium hydroxide (TMAH), ammoniumhydroxide, and/or potassium hydroxide (KOH). At 506, a second reactive ion etch is performed to form a lower region of the cavity with desired depth. The etch may be an anisotropic etch such as a reactive ion etch. At 508, the lower region of the cavity is filled with a first dielectric material. The filling may be achieved by chemical vapor deposition. The first material may be spin-on-dielectric, spin-on glass, and/or flowable oxide. At 510, the first material is recessed. The recessing may be achieved by chemical mechanical planarizing (CMP) first and followed by reactive ion etching (RIE) or selective wet etch process. At 512, the upper region of the cavity is filled with a second material. This filling may be performed by various CVD methods. The second material may be HDP oxide or SiN for stronger residual stress. At 514, the second material may be planarized to a level flush with a top surface of the semiconductor substrate. The planarization may be achieved by chemical mechanical polish (CMP).

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Moreover, in particular regard to the various functions performed by the above described components (assemblies, devices, circuits, etc.) the terms used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application. Therefore, it is to be understood that the appended claims are intended to cover all such modifications and changes that fall within the true spirit of the invention.

What is claimed is:

1. A semiconductor structure, comprising:
    a semiconductor substrate;
    a cavity formed in the semiconductor substrate, the cavity comprising an upper region and a lower region, wherein the upper region comprises a sigma cavity, and the lower region comprises a substantially rectangular cavity;
    a first dielectric layer disposed in the lower region; and
    a second dielectric layer disposed in the upper region, wherein the second dielectric layer is planar with a top surface of the semiconductor substrate.

2. The semiconductor structure of claim 1, wherein the first dielectric layer comprises at least one of a spin-on dielectric, spin-on glass dielectric, or flowable chemical vapor deposition (CVD) oxide.

3. The semiconductor structure of claim 1, wherein the second dielectric layer comprises high density plasma oxide.

4. The semiconductor structure of claim 1, wherein the second dielectric layer comprises silicon nitride.

5. The semiconductor structure of claim 1, further comprising a third dielectric layer disposed below the first dielectric layer.

6. The semiconductor structure of claim 5, wherein:
    the first dielectric layer comprises a CVD oxide;
    the second dielectric layer comprises a high density plasma (HDP) oxide or high-aspect-ratio process (HARP) oxide; and
    the third dielectric layer comprises at least one of a spin-on dielectric, spin-on glass dielectric, and a flowable CVD oxide.

7. The semiconductor structure of claim 1, wherein the sigma cavity comprises a tip that is disposed at a distance below the top surface of the semiconductor substrate ranging from about 6 nanometers to about 8 nanometers.

8. The semiconductor structure of claim 7, wherein the cavity has a depth ranging from about 100 nanometers to about 300 nanometers.

9. A semiconductor structure, comprising:
    a semiconductor substrate;
    a transistor disposed on the semiconductor substrate, the transistor comprising a source/drain region and a gate;
    a shallow trench isolation structure disposed adjacent to the source/drain region, the shallow trench isolation structure comprising:
        a cavity formed in the semiconductor substrate, the cavity comprising an upper region and a lower region, wherein the upper region comprises a sigma cavity, and the lower region comprises a substantially rectangular cavity;
        a first dielectric layer disposed in the lower region; and
        a second dielectric layer disposed in the upper region, wherein the second dielectric layer is planar with a top surface of the semiconductor substrate.

10. The semiconductor structure of claim 9, wherein the first dielectric layer comprises at least one of a spin-on dielectric, spin-on glass dielectric, and a flowable oxide.

11. The semiconductor structure of claim 9, wherein the second dielectric layer comprises at least one of a high density plasma oxide and a high-aspect-ratio process (HARP) oxide.

12. The semiconductor structure of claim 9, wherein the second dielectric layer comprises silicon nitride.

13. The semiconductor structure of claim 9, further comprising a third dielectric layer disposed below the first dielectric layer, wherein:
    the first dielectric layer comprises a chemical vapor deposition (CVD) oxide;
    the second dielectric layer comprises at least one of a high density plasma (HDP) oxide and a high-aspect-ratio process (HARP) oxide; and
    the third dielectric layer comprises at least one of a spin-on dielectric, spin-on glass dielectric, and a flowable oxide.

14. The semiconductor structure of claim 9, wherein:
    the source/drain region further comprises a compressive stress material; and
    the second dielectric layer comprises a compressive stress material.

15. The semiconductor structure of claim 9, wherein:
    the source/drain region further comprises a tensile stress material; and
    the second dielectric layer comprises a compressive stress material.

16. The semiconductor structure of claim 9, wherein:
    the source/drain region further comprises a tensile stress material; and
    the second dielectric layer comprises a tensile stress material.

17. The semiconductor structure of claim 9, wherein:
    the source/drain region further comprises a compressive stress material; and
    the second dielectric layer comprises a tensile stress material.

18. A method of making a semiconductor structure, comprising:
    performing a first anisotropic etch in a semiconductor substrate to form a cavity;
    performing a sigma etch on the cavity to form an upper region of the cavity;
    performing a second anisotropic etch to form a lower region of the cavity;
    filling the lower region of the cavity with a first material;
    filling the upper region of the cavity with a second material; and planarizing the second material to a level flush with a top surface of the semiconductor substrate.

19. The method of claim 18, wherein performing a sigma etch comprises performing an etch using tetramethylammonium hydroxide.

20. The method of claim 18, wherein:
filling the lower region of the cavity with a first material comprises filling the lower region with at least one of a spin-on glass, spin-on dielectric and a flowable oxide; and
filling the upper region of the cavity with a second material comprises filling the upper region of the cavity with at least one of a high density plasma oxide and a high-aspect-ratio process (HARP) oxide.

* * * * *